United States Patent [19]

Okatani et al.

[11] 4,263,581
[45] Apr. 21, 1981

[54] MANUAL TUNING PULSE GENERATOR

[75] Inventors: Masanao Okatani; Hiroshi Onishi; Yoshiaki Ishibashi; Reisuke Sato; Hisashi Suganuma; Tomohisa Yokogawa; Yoshiharu Ueki; Haruo Kama; Tadashi Kosuga; Tadashi Ogawa, all of Kawagoe, Japan

[73] Assignee: Pioneer Electronic Corporation, Tokyo, Japan

[21] Appl. No.: 917,226

[22] Filed: Jun. 20, 1978

[30] Foreign Application Priority Data

Jun. 20, 1977 [JP] Japan .................................. 52-73119

[51] Int. Cl.³ .......................... H03J 5/04; H03J 5/00; H03K 21/30
[52] U.S. Cl. ................................ 340/168 B; 328/44; 328/59; 455/170
[58] Field of Search ....................... 340/147 C, 168 R; 328/44, 59; 325/464, 455; 455/170

[56] References Cited

U.S. PATENT DOCUMENTS

| 3,023,373 | 2/1962 | Naylor | 328/44 X |
| 3,521,185 | 7/1970 | Ley | 328/59 X |
| 3,560,939 | 2/1971 | Lukacs | 340/147 C |
| 3,573,734 | 4/1971 | Williams et al. | 340/168 R |
| 3,651,469 | 3/1972 | Keese | 340/168 R |
| 3,714,585 | 1/1973 | Koch | 325/464 X |
| 4,119,902 | 10/1978 | Newell | 328/44 X |
| 4,132,905 | 1/1979 | Stein | 328/44 X |

Primary Examiner—John S. Heyman
Attorney, Agent, or Firm—Sughrue, Rothwell, Mion, Zinn and Macpeak

[57] ABSTRACT

A manual tuning pulse generator for use in an electronic tuning control device of a radio receiver having a tuning circuit, which control device utilizes an up/down counter, is disclosed which comprises a first manual means for selectively producing an up count signal and a down count signal to be supplied to the up/down counter, a second manual means ganged with said first manual means for producing a variable control signal and means responsive to the variable control signal to produce a clock pulse signal having a variable frequency, the pulses of the clock pulse signal being adapted to be counted up or down by the up/down counter the content of which is utilized to shift the tuning frequency.

5 Claims, 4 Drawing Figures

MANUAL TUNING PULSE GENERATOR

BACKGROUND OF THE INVENTION

This invention relates to a manually controllable tuning pulse generator adapted to supply a tuning pulse signal to an electronic tuning control device of an electronic tuning type radio receiver.

Known in the art is a radio receiver which comprises a tuning portion and a tuning control portion comprising a pulse generator capable of generating a count up or count down pulse signal depending upon a manual operation and a clock signal, an up/down counter for counting up or count down the clock signal from the pulse generator depending upon the count up or down pulse signal therefrom and a D-A converter responsive to a count output of the counter for supplying an analog channel selection voltage to varactor diodes included in the tuning portion to thereby operate the latter. The manual pulse generator comprises a disc formed along its periphery thereof with a plurality of slits and capable of being rotated manually and a pair of photo-electric devices each comprising a light emitting element and a light receiving element adapted to receive light from the light emitting element through the slits. The photoelectric devices are arranged in parallel with each other to facilitate the detection of the rotating direction of the disc to determine whether the pulse signal is for up counting or down counting of the clock signal. Such an arrangement is disclosed in copending application Ser. No. 915,098.

The tuning pulse generator constructed as above generates the clock pulse signal having a number of pulses which is proportional to a rotation angle of the disc. The tuning pulse generator of this type is advantageous in that the feeling of the operation of the disc is similar to that of the usual variable capacitor and a fine adjustment of the rotation angle is easy. However, when it is desired to select any one among a number of channels, it is troublesome to do so because a wide range of the disc rotation angle is necessary. In addition to this disadvantage, the pulse generator of this type is disadvantageous in space factor due to the mechanical construction thereof.

SUMMARY OF THE INVENTION

A primary object of the present invention is to provide a manually controllable tuning pulse generator which is fully electronic and facilitates a rapid coarse regulation as well as a rapid fine regulation.

Another object of the present invention is to provide a manually controllable tuning pulse generator of this type in which an on-off switch and a variable resistor ganged therewith are utilized to produce a count direction signal and a control signal for determining the frequency of the tuning pulse signal.

A still further object of the present invention is to provide a manually controllable tuning pulse generator of the type in which a push button switch system is utilized to produce a count up and down signal and the control signal.

Briefly, this is accomplished by providing a first switch having a grounded contact and one at a suitable potential for providing up- and down-count signals and potentiometer with two symmetrical legs so that turning the potentiometer in either direction provides a signal corresponding to the amount and direction of rotation. The outputs at the switch and potentiometer are connected to the U/D terminal and a pulse generator and the output of the latter is connected to the clock input terminal of the counter so that both the direction and speed of counting can be easily controlled. An astable multivibrator may be used to generate the clock pulses.

DETAILED DESCRIPTION OF THE PREFERRED EMBODIMENTS

Figure 1:
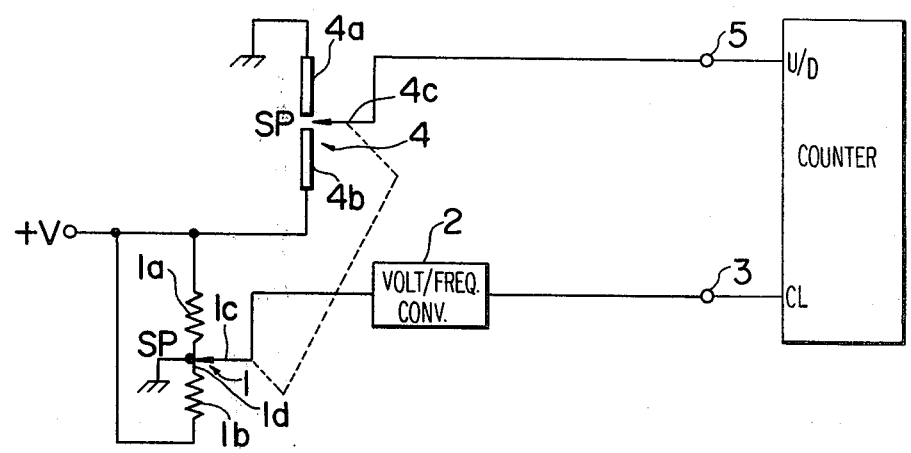
FIG. 1 is a schematic diagram of an embodiment of the present invention.

In FIG. 1 which shows an embodiment of the tuning pulse generator according to the present invention, a potentiometer 1 comprises two resistor halves 1a and 1b, one end of each being connected to a voltage source +V and the other end being connected together by a conductor 1d which is grounded. A potential of a slider 1c of the potentiometer is ground potential at a starting position SP where it is in contact with the conductor 1d and increases with the distance along either of the resistor halves from the conductor 1d.

The slider 1c is connected to a voltage-frequency converter 2 which converts the potential into frequency. A frequency output of the voltage-frequency converter 2 appears at a terminal 3 as a tuning pulse signal.

A switch 4 comprises a pair of fixed contact strips 4a and 4b and a movable contact 4c which is ganged with the slider 1c of the potentiometer 1 and is connected to a terminal 5. One end of the contact strip 4b is connected to a suitable voltage source +V and the contact strip 4a is grounded. There is a small gap between the contact halves 4a and 4b.

The length of each of the contact halves 4a and 4b of the switch 4 may be made equal to the length of each of the resistor halves 1a and 1b of the potentiometer 1 so that, when the slider 1c is at the point SP and grounded, the movable contact 4c, i.e. the terminal 5, becomes floating and, when the slider 1c contacts with either the resistor half 1a or 1b, the movable contact 4c is at either ground potential or the source voltage.

Figure 2:
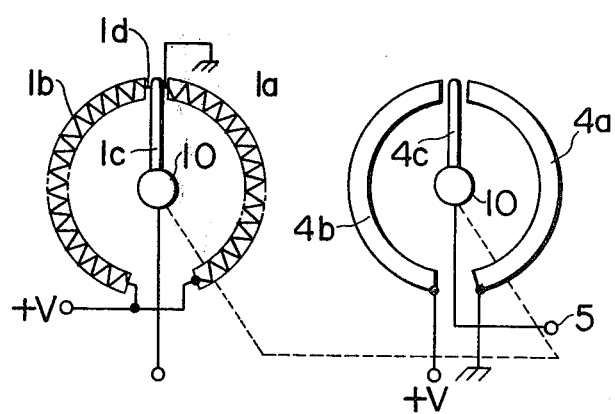
FIG. 2 is a schematic diagram of an example of the manual control portion of the embodiment in FIG. 1.

FIG. 2 shows an example of the structure of the combination of the potentiometer 1 and the switch 4 in which the latter two are constructed as a rotary type assembly.

In this construction, the ground potential at the terminal 5 is referred to as a count up signal and the source voltage at the terminal 5 is referred to as a count down signal.

In operation, there is no signal applied to an input of the voltage-frequency converter 2 when the switch 4 as well as the potentiometer 1 are in reset states in which the movable contact 4c and the slider 1c are at the center position SP, respectively, because the slider 1c is grounded through the conductor 1d. Therefore, the converter 2 provides no output.

When a shaft 10 of the assembly of the potentiometer 1 and the switch 4 is turned slightly, for example, rightwardly in FIG. 2, the movable contact 4c of the rotary switch 4 contacts with the fixed contact 4a, resulting in a count up signal at the output terminal 5. At the same time, the slider 1c of the potentiometer 1 is also turned slightly along the resistor half 1a and a relatively low voltage corresponding to the amount of rotation of the slider 1c is supplied to the voltage-frequency converter 2. The converter 2 provides a signal having a relatively low frequency corresponding to the low voltage at the output terminal 3. The signal at the terminal 3 is used as the tuning clock pulse signal.

Accordingly, an up/down counter (not shown) of the tuning section counts up the clock pulses supplied from the output terminal 3 according to the count up signal from the output terminal 5, and a channel selection is made according to the counter output.

In this case, since the period of the clock pulse signal is relatively long, the counting operation of the up/down counter is slow correspondingly. This can be effectively utilized to finely tune the selected channel.

When the shaft 10 is further rotated, the movable contact 4c of the rotary switch 4 moves along the contact strip 4a and the count up signal continues to exist at the terminal 5. On the other hand, the slider 1c of the potentiometer 1 moves towards the end of the resistor 1a connected to the voltage source +V and a higher voltage appears at the slider 1c, the value being determined by the rotation angle of the shaft. Therefore, the voltage-frequency converter 2 provides a higher output frequency and thus a higher frequency tuning pulse signal is supplied through the output terminal 3 to the up/down counter, so that the output of the up/down counter increases and thus the receiver is rapidly tuned to the higher receiving signal frequency.

When the shaft 10 is turned leftwardly from the center position SP, the same effect as that obtainable when it is turned rightwardly is obtained. In this case, however, the movable contact 4c of the rotary switch 4 contacts with the fixed contact strip 4b connected to the voltage source +V. Therefore a count down signal is provided at the output terminal 5. The slider 1c of the potentiometer 1 contacts with the resistor half 1b providing a voltage output which causes the voltage-frequency converter 2 to provide a tuning pulse signal, the frequency thereof being determined by the position of the slider 1c on the resistor half 1b. As a result, the up/down counter responds to the down count signal to count down the tuning pulses, so that the tuning is performed toward the lower frequency side at a speed determined by the tuning pulse signal frequency. With the turning amount of the shaft 10 increased, the voltage output at the slider 1c of the potentiometer 1 increases and the output frequency of the voltage-frequency converter 2 increases correspondingly causing a speed up of the downward shift of the tuning frequency.

As mentioned above, with the rightward turning of the shaft 10, the up/down counter counts up the tuning pulses, the frequency of which corresponds to the turning amount of the shaft. The counting speed also corresponds to the turning amount with the leftward turning of the shaft 10 and the up/down counter counts down the tuning pulses, the frequency of which corresponds to the turning amount, and thus the counting speed corresponds to the turning amount.

Therefore, the coarse adjustment can be performed by increasing the turning amount of the shaft 10 in either direction and thereafter the fine adjustment can be performed by returning the shaft 10.

The shaft 10 may be constructed such that it returns to the rest position SP automatically upon completion of the tuning.

Figure 3:
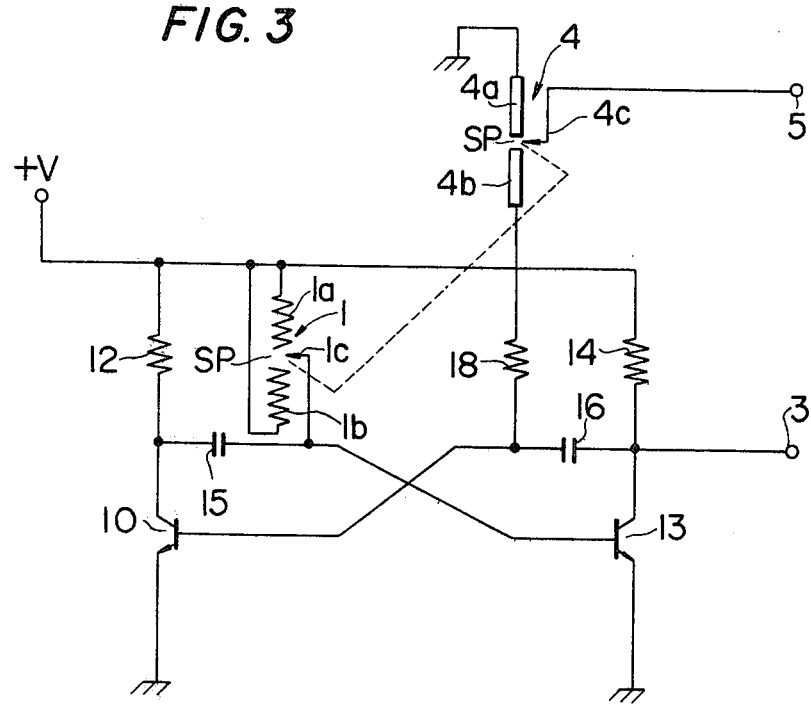
FIG. 3 is a schematic diagram of another embodiment of the present invention in which the same components are represented by the same numerals.

FIG. 3 shows another embodiment of the present invention, in which substantially the same assembly of the potentiometer and the rotary switch is used for the mannual control. A difference in structure of the manual control assembly is that the conductor 1d connecting the adjacent ends of the resistor halves 1a and 1b is omitted to make the ends in floating state.

In FIG. 3, a first transistor 10 has a collector connected through a resistor 12 to the voltage source +V, an emitter grounded and a base. A second transistor 13 has a collector connected through a resistor 14 to the voltage source +V, an emitter grounded and a base connected through a capacitor 15 to the collector of the first transistor 10. The base of the latter is connected through a capaciter 16 to the collector of the second transistor 13.

The base of the first transistor is also connected through a resistor 18 to the fixed contact strip 4b of the rotary switch 4 and to the voltage source +V and the base of the second transistor is connected to the slider 1c of the potentiometer 1. As will be clear for those skilled in the art, this circuit construction forms an astable multivibrator.

The manual control assembly is preferably of the auto-return type as mentioned above so that when the manual control is removed the slider 1c of the potentiometer 1 and the movable contact 4c of the rotary switch 4 return to their center positions automatically.

In operation, with the slider 1c and the movable contact 4c at the center position SP, there is substantially no base voltage of the transistor 13 and it is in a non-conduction state. Therefore, the multivibrator does not provide the tuning pulse signal to the output terminal 3.

When the shaft 10 is slightly turned in either direction, for example, rightwardly, the movable contact 4c contacts with the grounded fixed-contact strip 4a and the count up signal appears at the terminal 5.

At the same time, the slider 1c of the potentiometer 1 rides on the resistor half 1a. The resistance value of the potentiometer 1 connected between the voltage source +V and the base of the transistor 13 is proportional to the moving or rotating amount of the slider 1c. Since the oscillation period of the multivibrator is determined by $R_1 \cdot C_{15} + R_{18} \cdot C_{16}$ where $C_{15}$ and $C_{16}$ are capacitance values of the capacitors 15 and 16, respectively, and $R_{18}$ is the resistance value of the resistor 18, the larger the resistance value of the potentiometer 1 provides the longer the period.

Figure 4:
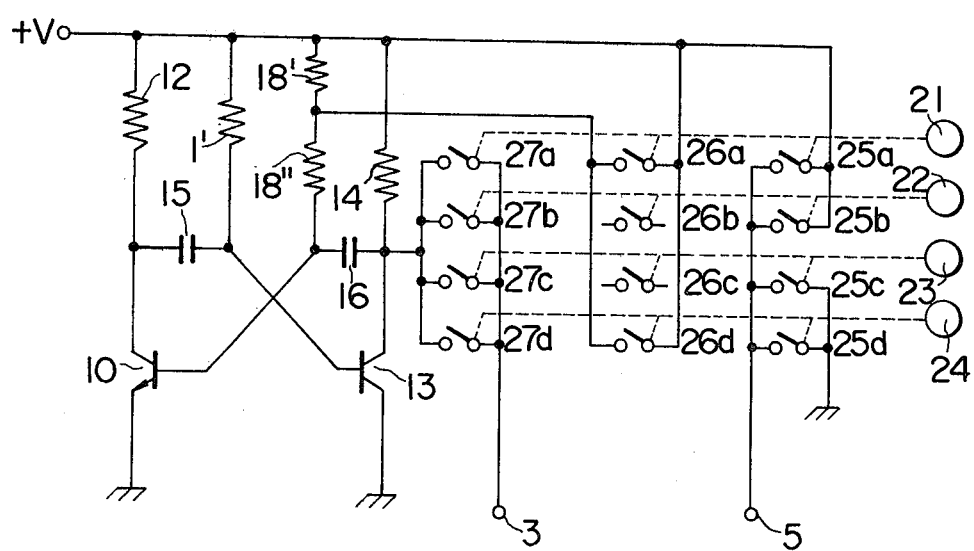
FIG. 4 is a schematic diagram of still another embodiment of the present invention in which the same components are represented by the same numerals.

FIG. 4 is still another embodiment of the present invention which uses an astable multivibration as in the embodiment in FIG. 3. Although in the embodiments in FIGS. 1 and 3, the manual control is performed by a potentiometer and a single pole double throw switch ganged with the potentiometer, a non-lock type pushbutton switch system is employed in the embodiment in FIG. 4.

In FIG. 4, a fixed resistor 1' is inserted between the voltage source +V and the base of the second transistor 13, as a replacement of the potentiometer 1. The resistor 18 in FIG. 3 is replaced by a resistor 18' and a resistor 18" connected in series with the resistor 18'.

The non-lock type push-button switch system comprises four non-lock type switch buttons 21 to 24 each having three on-off switches. The button 21 is referred to as a high-speed count-up button and has a direction detecting switch 25a, a speed control switch 26a and a tuning pulse switch 27a, all of the switches being ganged.

A low-speed count-up button 22 has a direction detecting switch 25b, a speed control switch 26b and a tuning pulse switch 27b. A low-speed count-down button 23 and a high-speed count-down button 24 have direction detecting switches 25c and 25d, speed control switches 26c and 26d and tuning pulse switches 27c and 27d, respectively.

These switches 25a to 25d, 26a to 26d and 27a to 27d are normally open and, when any button is despressed, the switches associated therewith are closed.

The direction detecting switches 25a and 25b are connected in parallel and one end is connected to the voltage source +V. The other end of the parallel switches is connected to the output terminal 5. The switches 25c and 25d are also connected in parallel, one end being grounded and the other end being connected to the output terminal 5. The speed control switches 26a and 26d are connected in parallel, one end being connected to the voltage source +V and the other end being connected to a junction of the series resistors 18′ and 18″ of the astable multivibrator.

The tuning pulse switches 27a to 27d are connected in parallel, one end being connected to the output of the multivibrator and the other being connected to the output terminal 3.

In operation, a button for example, the high-speed count-up button 21 is despressed, the switches 25a, 26a and 27a are closed and thus the source voltage appears through the switch 25a at the terminal 5 as a count-up signal H. With the switch 26a closed, the resistor 18′ is short-circuited. By this short-circuit of the resistor, the value of the resistor is reduced to that of the resistor 18″, resulting in a high frequency oscillation of the multivibrator. The output of the multivibrator appears through the closed switch 27a at the terminal 3. According to the high frequency pulse output at the terminal 3 and the count-up signal at the terminal 5, the up-/down counter counts up the output pulses during the depression of the button 21 and thus a high-speed shift in tuning frequency is achieved. The tuning frequency shift thus achieved is maintained after the operation of the button is terminated.

By depressing the low-speed count-up button 22, the switches 25b, 26b and 27b are closed. In this case, the source voltage is also supplied through the switch 25b to the terminal 5 as the count-up signal and the output of the multivibrator is supplied through the switch 27b to the terminal 3. In this case, however, the resistor 18′ is not short-circuited and, therefore, the frequency of the output pulses at the therminal 3 is lower than that where the button 21 is operated. Accordingly, the frequency shift to be done by the counter and hence the tuning circuit becomes slow which is suitable to achieve a fine tuning. After the desired frequency shift is achieved, the depression of the button 22 is terminated, so that the output at the terminal 3 disappears and the tuned frequency is fixed.

Depressions of the low-speed count-down button 23 and the high-speed count-down button 24 provide the same effect as that of the buttons 22 and 21, respectively, except that the terminal 5 is grounded and provides a count-down signal.

As described hereinbefore, according to the present invention, it is made possible to facilitate the coarse and fine adjustments of the tuning frequency with a manually controlled freuqency generator. It should be noted, in this connection, that although the manual control of the tuning pulse frequency is performed by the combination of the potentiometer and the rotary switch ganged therewith in the embodiments in FIGS. 1 and 3 and by the non-lock type switch system in the embodiment in FIG. 4, there may be various modifications thereof. Further, the voltage-frequency converter and the astable multivibrator are mere examples of the pulse generators which are controlled manually.

What is claimed is:

1. A manual tuning pulse generator for use in an electronic tuning control device of a radio receiver having an up/down counter with a counting direction control input and a clock input, comprising: a first manual means movable between a first position for producing a first signal, a second position for producing a second signal, and a neutral position for producing a neutral signal, a second manual means ganged with said first manual means for producing a variable signal and means responsive to said variable signal to produce a clock pulse signal having a variable frequency corresponding thereto, said first manual means being connected to the counting direction control input of the up/down counter and said variable signal producing means being connected to the clock input of the up/down counter as a clock pulse signal so that the up/down counter counts up said clock pulse signal upon receiving said first signal, counts down upon receiving said second signal and performs no counting upon receiving said neutral signal, said first manual means being mechanically biased toward said neutral position whereby said first manual means will automatically return to its neutral position when released and counting by said up/down counter will cease.

2. A manual tuning pulse generator as claimed in claim 1, wherein said first manual means is a switch having a first fixed contact connected to a suitable voltage source, a second fixed contact grounded, a neutral position between said first and second fixed contacts and a movable contact biased toward said neutral position and capable of contacting selectively with said first and second fixed contacts when manually operated, said movable contact returning to said neutral position when released, and wherein said first signal is a source voltage and said second signal is the ground potential.

3. A manual tuning pulse generator as claimed in claim 2, wherein said second manual means ia a potentiometer comprising a slider and a pair of resistors having equal resistances, one end of each said resistor being connected to a grounded conductor and the other end of each resistor being connected to said voltage source, said slider normally contacting said grounded conductor when said first manual means is in said neutral position, and wherein said means for producing the clock pulse signal is a voltage frequency converter responsive to an output of said potentiometer.

4. A manual tuning pulse generator as claimed in claim 2, wherein said second manual means is a potentiometer comprising a slider and a pair of resistors having equal resistances, one end of each of said resistors being connected to said voltage source and the other ends floating, said slider being normally floating when said first manual means is in said neutral position, and wherein said means for producing the clock pulse signal is an astable multivibrator having a time constant determined by the resistance value of said potentiometer.

5. A manual tuning pulse generator for use in an electronic tuning control device of a radio receiver having an up/down counter with a counting direction control input and a clock input, comprising:

a first manual means for selectively producing one of a first signal and a second signal, said first manual means comprising a plurality of normally opened non-lock type push button switches grouped into two groups, said switches belonging to one of said groups being connected in parallel and having one end connected to a suitable voltage source and said switches belonging to the other group being connected in parallel and having one ends grounded, the other ends of said switches being connected together and forming an output of said first manual means;

a second manual means ganged with said first manual means for producing a variable signal, said second manual means comprising a plurality of series connected resistors grouped into two groups and having a resistance which is varied in accordance with the manual selection of one of said switches; and means responsive to said variable signal for producing a clock pulse signal having a variable frequency corresponding thereto, said means for producing said clock pulse signal comprising an astable multivibrator having a time constant determined by said resistance;

said first manual means being connected to the counting direction control input of said up/down counter and said variable signal producing means being connected to the clock input of said up/down counter as a clock pulse signal so that said up/down counter counts up said clock pulse signal upon receiving said first signal and counts down upon receiving said second signal.

* * * * *